United States Patent [19]

Urakawa et al.

[11] Patent Number: 5,027,009
[45] Date of Patent: Jun. 25, 1991

[54] SEMICONDUCTOR LOGIC CIRCUIT WITH A BIPOLAR CURRENT MIRROR ARRANGEMENT

[75] Inventors: Yukihiro Urakawa, Kawasaki; Masataka Matsui, Tokyo, both of Japan

[73] Assignee: Kabushiki Kaisha Toshiba, Kawasaki, Japan

[21] Appl. No.: 457,190

[22] Filed: Dec. 26, 1989

[30] Foreign Application Priority Data

Dec. 28, 1988 [JP] Japan ................... 63-333585

[51] Int. Cl.[5] .................. H03K 19/02; H03K 19/094
[52] U.S. Cl. .................................. 307/446; 307/451; 307/570; 330/257; 330/288
[58] Field of Search ............ 307/443, 448, 451, 446, 307/570; 330/257, 288

[56] References Cited

U.S. PATENT DOCUMENTS

| | | | |
|---|---|---|---|
| 4,798,981 | 1/1989 | Tsugaru et al. | 307/446 |
| 4,810,902 | 3/1989 | Storti et al. | 307/446 |
| 4,883,988 | 11/1989 | Ide et al. | 307/446 |

Primary Examiner—Stanley D. Miller
Assistant Examiner—Margaret Rose Wambach
Attorney, Agent, or Firm—Banner, Birch, McKie & Beckett

[57] ABSTRACT

A semiconductor logic circuit includes a bipolar totem pole buffer. The buffer is made up of a first npn bipolar transistor whose collector-emitter path is connected between a first power source node and an output node, and a second npn bipolar transistor whose collector-emitter path is connected between the output node and a second power source node. A third npn bipolar transistor is connected at the collector and the base to the base of the second npn bipolar transistor, and at the emitter to the second power source node. An output transistor drive circuit includes a MOS transistor. The drain-source path of the MOS transistor is connected between a third power source node, which is placed at one of potentials equal to and lower than the potential of the first power source node, and the base of the second npn bipolar transistor. The gate of the MOS transistor is connected to a signal input node.

27 Claims, 6 Drawing Sheets

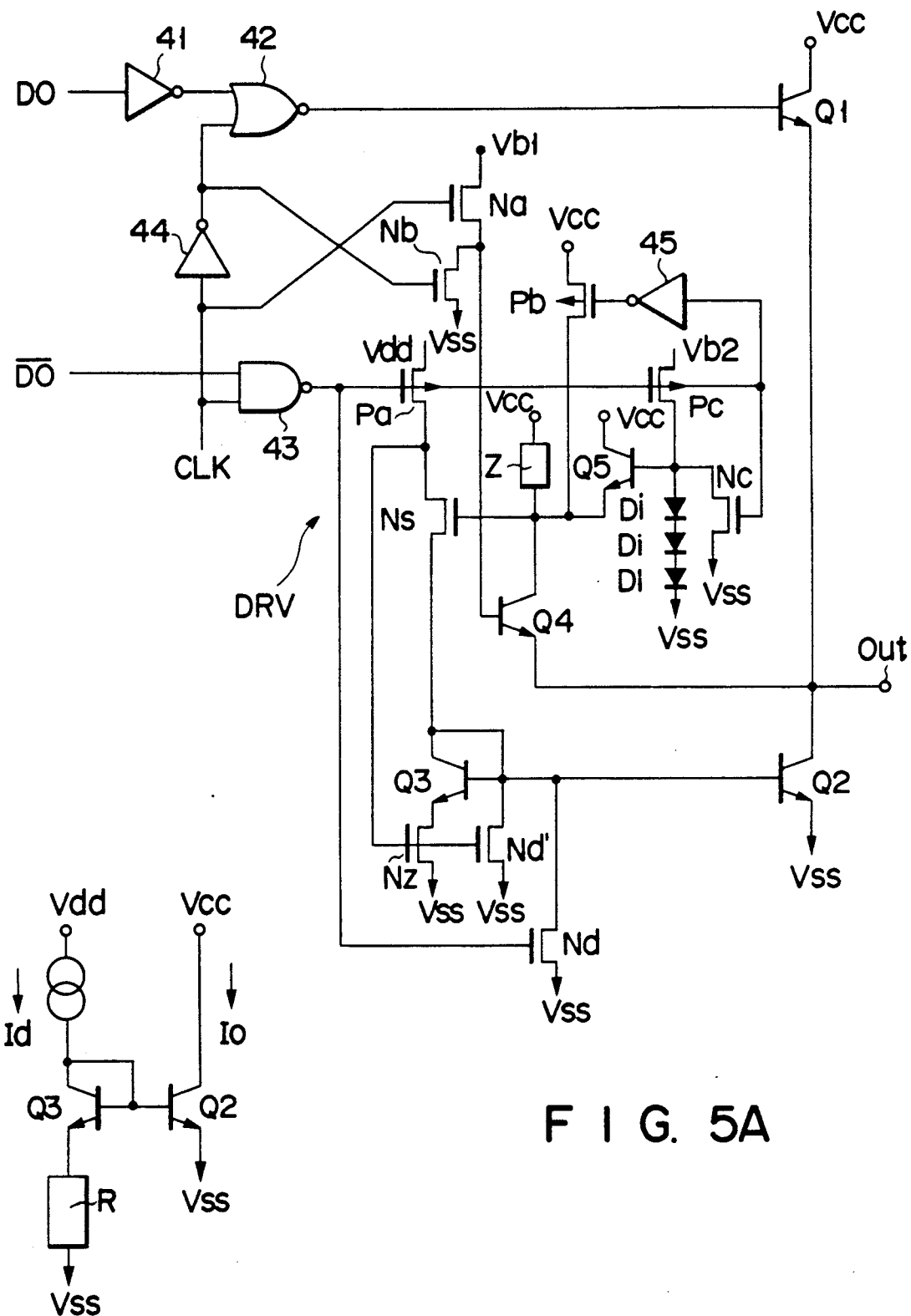
F I G. 5A
F I G. 5B

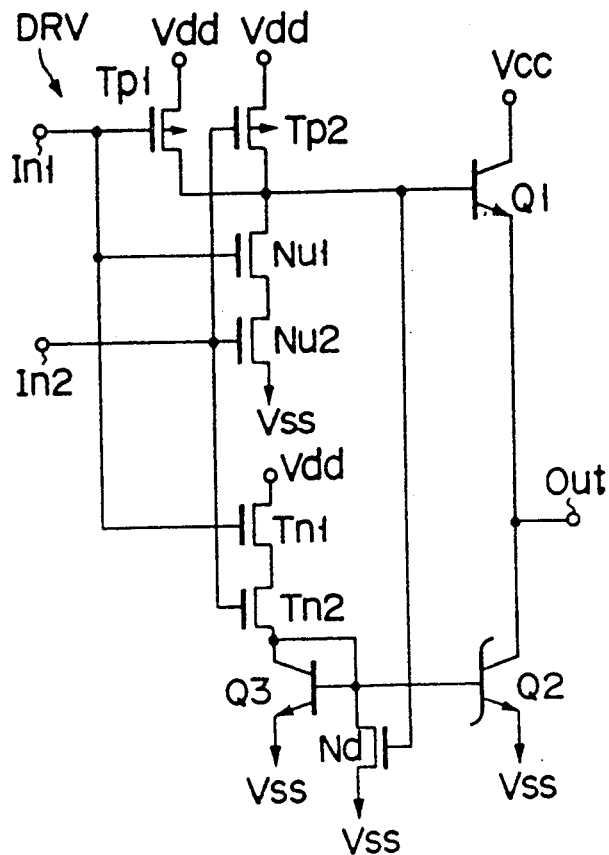
F I G. 6
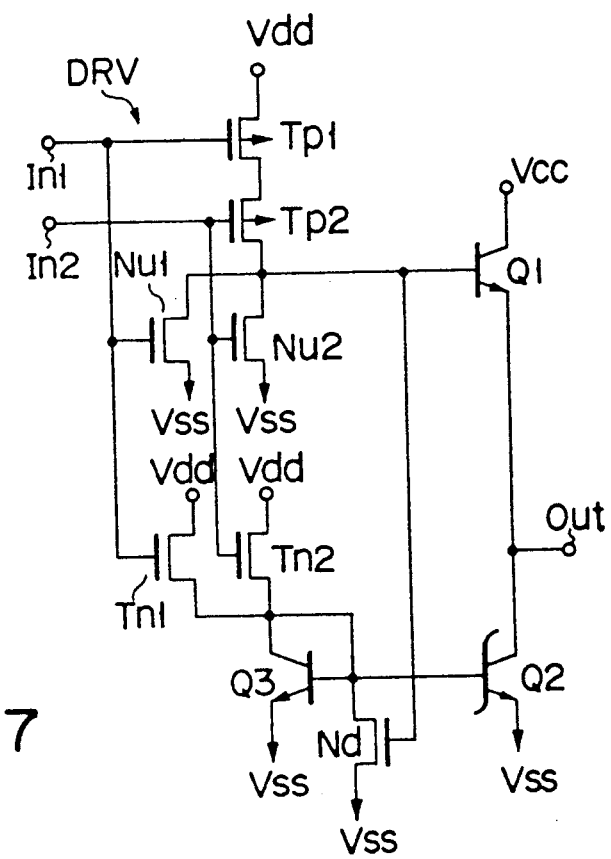
F I G. 7

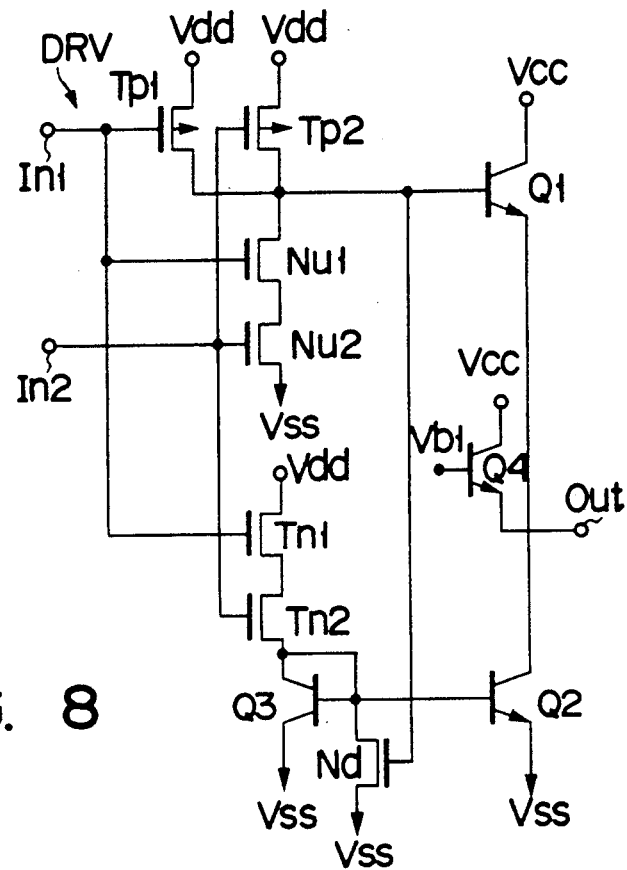
F I G. 8
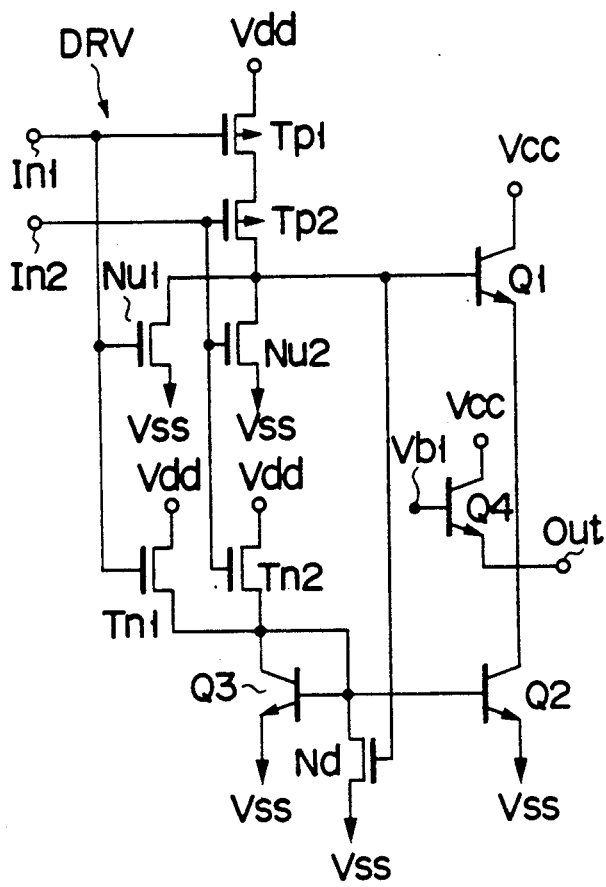
F I G. 9

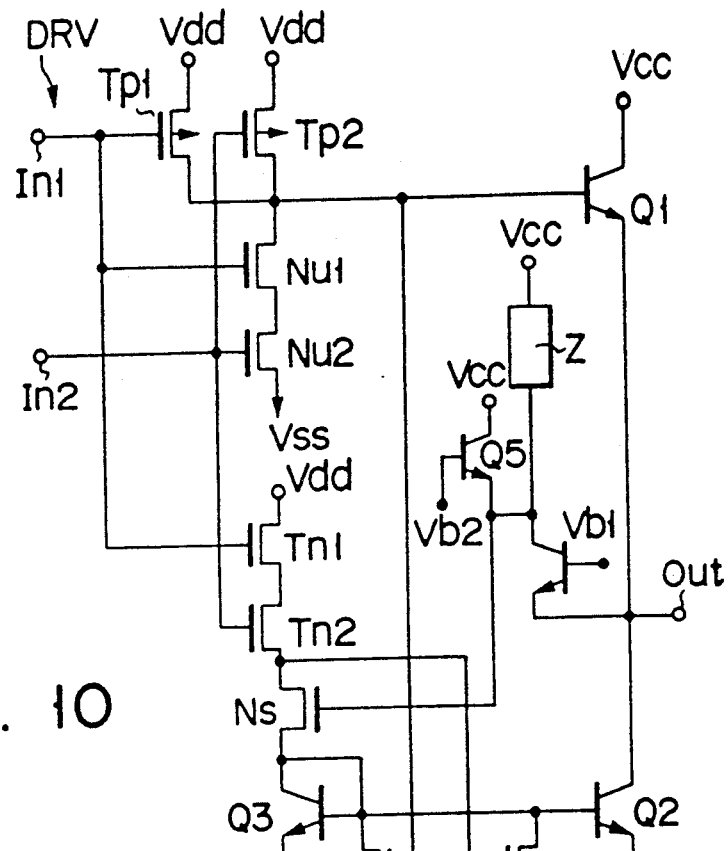
F I G. 10
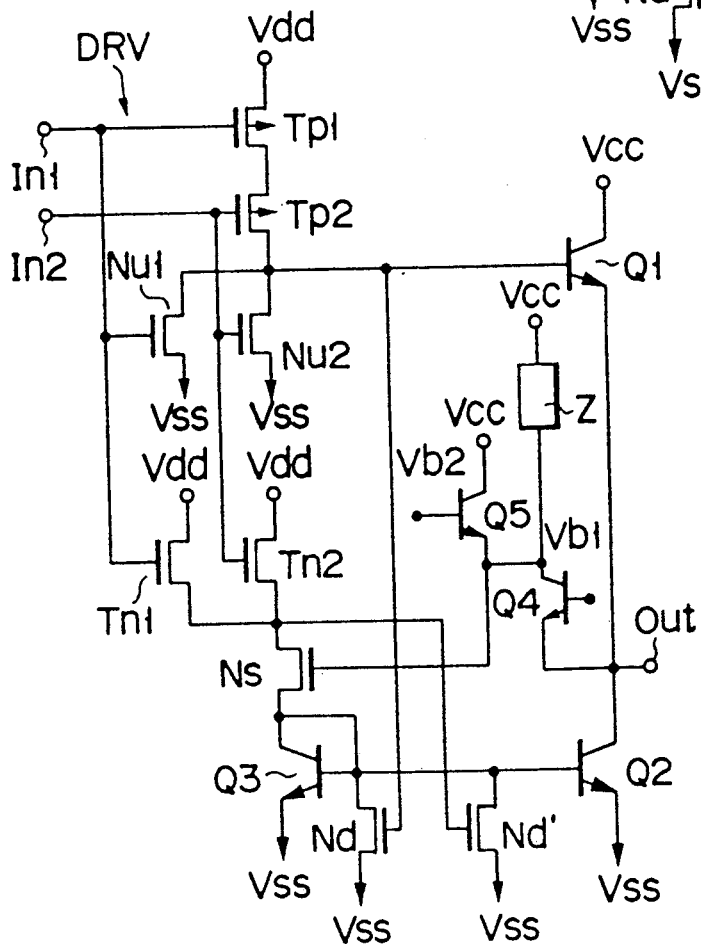
F I G. 11

SEMICONDUCTOR LOGIC CIRCUIT WITH A BIPOLAR CURRENT MIRROR ARRANGEMENT

BACKGROUND OF THE INVENTION

1. Field of the Invention

The present invention relates to a semiconductor logic circuit, and more particularly to a Bi-CMOS logic circuit of the type in which bipolar (Bi) elements and complementary oxide semiconductor (CMOS) elements are formed on a substrate.

2. Description of the Related Art

Recently, in manufacturing semiconductor logic circuits, for example, emphasis has been placed on how to integrate circuit elements at a high density in accordance with the scaling rule, so as to improve an operating speed of the integrated circuits. In the case of MOS transistors, attempts have been made on reducing the channel width and thinning the gate oxide film so as to integrate circuit elements at a high density and improve the operating speed of the integrated circuits. However, thinning of the gate oxide film results in a large voltage applied to the oxide film and therefore its reliability will not be assured over a long period. For this reason, it is required for microfabricated MOS transistors to lower the power source voltage before applied to the oxide film. This is not easily done because compatibility with other devices is required. One solution for the above problem is to use the internal power source voltage drop technique in which a voltage drop circuit is incorporated in the integrated circuit so as to obtain a low voltage and use it as an internal power source.

Let us consider a case where a Bi-CMOS inverter, for example, is used for an output system of a BI-CMOS semiconductor logic circuit containing such a power source voltage drop circuit. In such a circuit arrangement, improvement of an operating speed is made by driving the base current of the output buffer using a pair of bipolar transistors by using a CMOS element. Further, an external power source voltage is applied to the collector of a pull-up bipolar transistor of the paired ones. An internal power source supplied from the power source drop circuit is supplied to the source of the p-channel MOS transistor of the CMOS element.

In the Bi-CMOS inverter, the drain of the n-channel MOS transistor is directly connected to an output node Out. Because of this connection, there is the possibility that the external power source voltage is applied across the source-drain path. In this respect, reliability of the gate oxide film of the MOS transistor is not assured.

Where a Bi-CMOS inverter is used in the output system of the Bi-CMOS semiconductor logic circuit, some measure must be taken. One measure is to set the gate oxide film of the n-channel MOS transistor thicker than those of the other MO transistors in the manufacturing stage. This measure, however, needs an increase of the number of process steps. The increased number of process steps leads to reduction of a production yield, and increase of cost to manufacture.

SUMMARY OF THE INVENTION

Accordingly, an object of the present invention is to provide a semiconductor logic circuit which secures a good reliability of the gate oxide films of MOS transistors as circuit elements.

To achieve the above object, there is provided a semiconductor logic circuit comprising: a bipolar totem pole buffer made up of a first npn bipolar transistor whose collector-emitter path is connected between a first power source node and an output node, and a second npn bipolar transistor whose collector-emitter path is connected between the output node and a second power source node; a third npn bipolar transistor whose collector and base are connected to the base of the second npn bipolar transistor and emitter is connected to the second power source node; and an output transistor drive circuit including a first MOS transistor whose drain-source path is connected between a third power source node placed at one of potentials equal to and lower than the potential of the first power source node, and the base of the second npn bipolar transistor, and whose gate is connected to a signal input node.

BRIEF DESCRIPTION OF THE DRAWINGS

Other objects, features, and advantages of the invention will be apparent when carefully reading the following detailed description in connection with the accompanying drawings, in which:

FIG. 5A is a circuit diagram of a three-state output buffer according to an additional embodiment of the present invention;

FIG. 5B is a circuit diagram of a part of the tri-state output buffer of FIG. 5A;

FIGS. 6, 8 and 10 are circuit diagrams of a Bi-CMOS NAND circuit according to other embodiments of the present invention; and FIGS. 7, 9, and 11 are circuit diagrams of a Bi-CMOS NOR circuit according to other embodiments of the present invention.

DETAILED DESCRIPTION OF THE PREFERRED EMBODIMENTS

Some specific embodiments of the present invention will be described with reference to the accompanying drawings.

Figure 1:
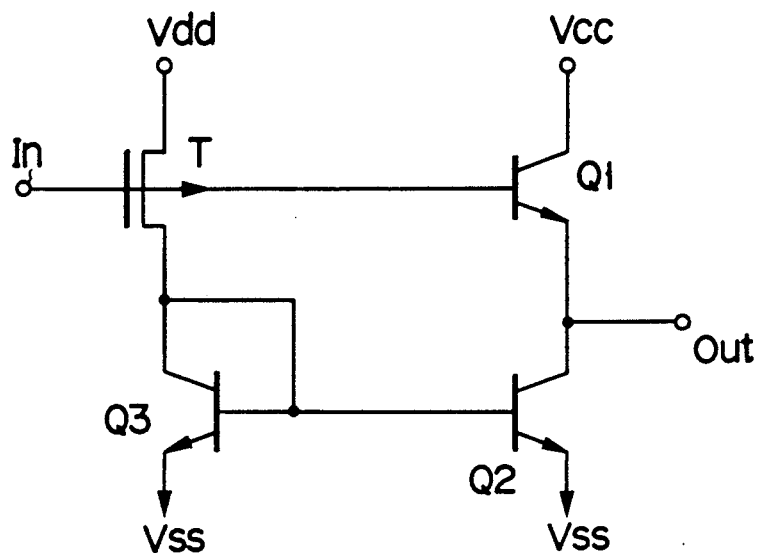
FIG. 1 is a circuit diagram of a Bi-CMOS buffer according to an embodiment of the present invention.

FIG. 1 shows a semiconductor logic circuit according to an embodiment of the present invention. The logic circuit of FIG. 1 is a Bi-CMOS buffer circuit, which is used in an output system of a Bi-CMOS semiconductor logic circuit containing a power source voltage drop circuit. In the circuit, Q1 designates a first npn bipolar transistor whose collector-emitter path is connected between an output node Out and a first power source node (Vcc potential node), which receives a Vcc potential from the outside of an integrated circuit. Q2 designates a second npn bipolar transistor whose collector-emitter path is connected between the output node Out and a second power source node (Vss node), which is placed at a Vss potential (ground potential). The transistors Q1 and Q2 make up a bipolar totem pole buffer in which the collector-emitter paths of the transistors are connected in series between the Vcc node and the Vss node, the bases of the transistors are driven in a complementary manner, and an output signal is derived from an output node Out. Q3 designates a third npn bipolar transistor whose collector and base are connected together to the base of the transistor Q2, and emitter is connected to the Vss node. The bipolar transistors Q2 and Q3 make up a bipolar current mirror circuit.

A p-channel MOS transistor T as an output transistor driver is further contained, whose source-drain path is connected between a third power source node (Vdd node) and the collector of the transistor Q3. The Vdd node receives a Vdd potential equal to or lower than that at the Vcc node, from power source voltage drop circuit (not shown). The MOS transistor is indirectly connected to the output node Out.

The operation of the Bi-CMOS buffer circuit will be described.

When an input voltage Vin changes its level from a low level "0" to a high level "1", the transistor T is turned off, and the transistor Q3 is also turned off. With the current mirror arrangement, the transistor Q2 is also turned off. The transistor Q1 is turned on. Accordingly, the output node Vout changes its signal level to the high level "1".

When the input voltage Vin changes its level from "1" to "0", the transistor T is turned on, and the transistor Q3 is also turned on. With the current mirror arrangement, the transistor Q2 is also turned on. Normally, a large load is connected to the output node Vout. A transient time of the output node Vout from "1" to "0", is longer than a transient time of the input voltage Vin from "1" to "0". Accordingly, the transistor Q1 is turned off, and the output node Vout goes low ("0") in logic level.

In the Bi-CMOS buffer circuit thus arranged, it is noted that the MOS transistor is indirectly connected to the output node. The circuit arrangement successfully prevents the external power source voltage from being directly applied to between the gate and the drain of the MOS transistor. In other words, the circuit arrangement ensures a good reliability of the gate oxide film of the MOS transistor. The Bi-CMOS inverter of this embodiment, which succeeded in solving the gate oxide film reliability problem by the circuit technique, is free from the increase of the number of process steps, which results in reduction of a production yield, and increase of cost to manufacture. Those problems, as already mentioned, are inevitable problems of the prior art in which the gate oxide film of the MOS transistor in question is set to be thicker than those of other MOS transistors in the manufacturing stage.

Figure 2:
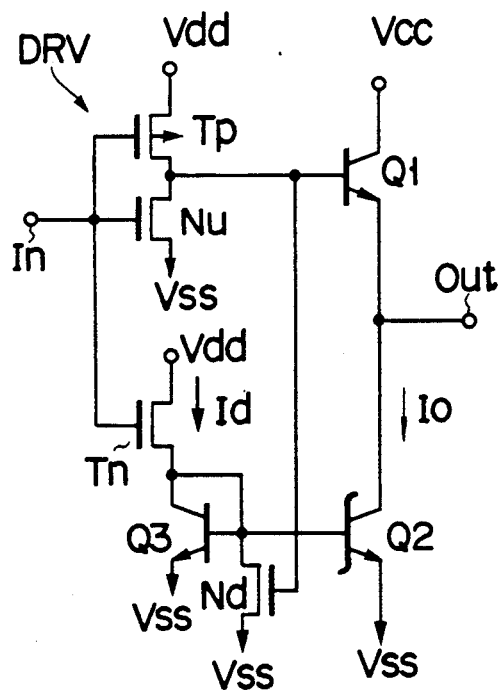
FIG. 2 is a circuit diagram of a Bi-CMOS inverter according to another embodiment of the present invention.

FIG. 2 shows a semiconductor logic circuit according to another embodiment of the present invention. The logic circuit of FIG. 2 is a Bi-CMOS inverter, which is used in an output system of a Bi-CMOS semiconductor integrated circuit containing a power source voltage drop circuit. In the circuit, Q1 designates a first npn bipolar transistor whose collector-emitter path is connected between an output node Out and a first power source node (Vcc potential node), which receives a Vcc potential from the outside of an integrated circuit. Q2 designates a second npn bipolar transistor (e.g., a Schottky barrier type transistor) whose collector-emitter path is connected between the output node Out and a second power source node (Vss node), which is placed at a Vss potential (ground potential). The transistors Q1 and Q2 make up a bipolar totem pole buffer in which the collector-emitter paths of the transistors are connected in series between the Vcc node and the Vss node, the bases of the transistors are driven in a complementary manner, and an output signal is derived from an output node Out. Q3 designates a third npn bipolar transistor whose collector and base are connected together to the base of the transistor Q2, and emitter is connected to the Vss node. The bipolar transistors Q2 and Q3 make up a bipolar current mirror circuit.

In an output transistor driver DRV, Tp designates a p-channel MOS transistor for base current drive, whose source-drain path is connected between a third power source node (Vdd node) and the base of the transistor Q1. The Vdd node receives a Vdd potential equal to or lower than that at the Vcc node, from power source voltage drop circuit (not shown). Tn designates an n-channel MOS transistor for base current drive, whose source-drain path is connected between the Vdd node and the interconnection of the bases of the transistors Q3 and Q2. The gates of the transistors Tp and Tn are connected together to a signal input node In. Nu denotes an n-channel MOS transistor for pulling out base charges whose drain-source path is connected between the base of the transistor Q1 and the Vss node, and gate is connected to the input node In. Nd denotes an n-channel MOS transistor for pulling out base charges whose drain-source path is connected between the Vss node and an interconnection of the bases of the transistors Q3 and Q2, and gate is connected to the base of the transistor Q1.

It is noted that none of the MOS transistors in the drive circuit DRV are directly connected to the output node Out.

The operation of the Bi-CMOS inverter thus arranged will be described. When an input signal changes its logical level from the low level "0" to the high level "1", The MOS transistor Tp is turned off, and the MOS transistor Tn is turned on. A drain current Id of the transistor Tn drives the transistor Q3, and then the pull-down transistor Q2, which is coupled with the transistor Q3 in a current mirror fashion, is driven. Finally, the output node Vout is pulled down. An output current Io is given by $$Io = Id \cdot A2/A3$$

where A2 and A3 designate the emitter areas of the transistors Q2 and Q3. The above relation shows that a desired output current Io can be obtained by selectively setting the ratio A2/A3.

Since the transistor Q2 is of the Schottky barrier type, the potential of the "0" output level as pulled down is clamped at approximately 0.5V, so that it will never be placed in a deep saturation. When the input signal is "1", the MOS transistor Nu is in an on state, and its drain potential is equal to the Vss potential. The transistor Q1 is then in an off state, since its base charge is pulled out by the transistor Nu. At this time, the MOS transistor Nd, which is coupled at the gate with the drain potential of the transistor Nu, is in an off state.

When a logic state of the input signal is changed from "1" to "0", the transistor Tp is turned on and the transistors Tn and Nu are turned off. By the drain current of the transistor Tp, the pull-up transistor Q1 is driven, and the output potential is pulled up. At this time, the base charge of the transistor Q2 is pulled out mainly by the transistor Q3, and the transistor Q2 is turned off. The MOS transistor Nd, which is coupled at its gate with the drain potential of the MOS transistor Tp, supplementally pulls out the base charges of the transistor Q2. This quickens the turn-off of the transistor Q2, to prevent an increase of the through-current between the Vcc and Vss power sources.

In the Bi-CMOS inverter thus arranged, none of the MOS transistors are directly connected to the output node. The circuit arrangement successfully prevents the external power source voltage from being directly applied to between the gate and the drain of the MOS transistor. In other words, the circuit arrangement ensures a good reliability of the gate oxide film of the MOS transistor. The Bi-CMOS inverter of this embodiment, which succeeded in solving the gate oxide film reliability problem by the circuit technique, is free from the increase of the number of process steps, which results in reduction of a production yield, and increase of which results in cost to manufacture. Those problems, as already mentioned, are inevitable problems of the prior art in which the gate oxide film of the MOS transistor in question is set to be thicker than those of other MOS transistors in the manufacturing stage.

Figure 3:
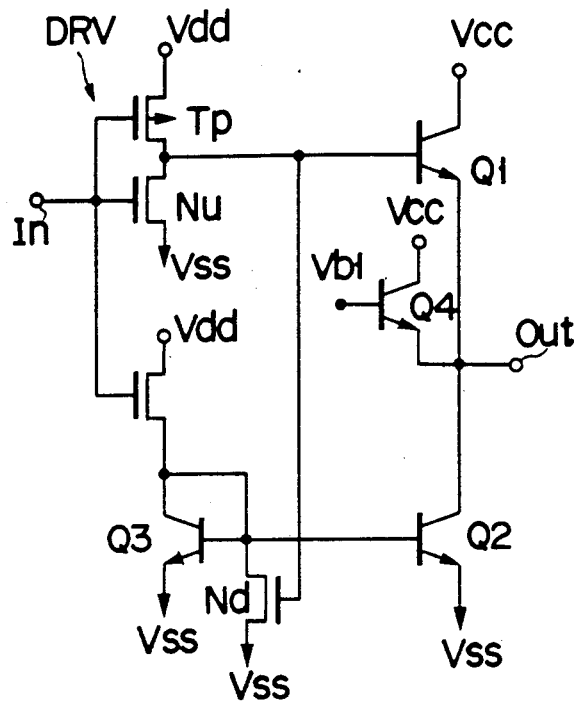
FIG. 3 is a circuit diagram of a Bi-CMOS inverter according to yet another embodiment of the present invention.

A Bi-CMOS inverter shown in FIG. 3 is different from that of FIG. 2 in that a second npn bipolar transistor Q2 is of the ordinary type, not the Schottky barrier type, and that in the transistor drive circuit DRV, a 4th npn bipolar transistor Q4 is additionally used. The transistor Q4 is arranged such that its base receives a first reference potential Vb1, e.g., approximately 1.3V, and its collector-emitter path is inserted between the Vcc node and the output node Out. The remaining arrangement of FIG. 3 is the same as that of FIG. 2. In the arrangement, like portions are designated by like symbols in FIG. 2.

The basic operation of the Bi-CMOS inverter of FIG. 3 is similar to that of FIG. 2, except the following operations. When the input signal is logical "1", the transistor Q2 is driven, and the potential at the output node Out is pulled down. When the potential at the output node drops below the cutoff voltage of the transistor Q2 of about 0.5V, $Vb1-Vf=0.5V$, the transistor Q4 is turned on, and clamps the output potential. That is, the transistor Q4 detects the output potential of a logic "0" level and clamps the output level at the same time. This eliminates the use of a bipolar transistor of the Schottky barrier type and reduces the overhead involved in manufacturing process.

Also in the Bi-CMOS inverter of FIG. 3 thus arranged, none of the MOS transistors are directly connected to the output node. The inverter of FIG. 3 has advantageous effects comparable with those of the inverter of FIG. 1.

Figure 4:
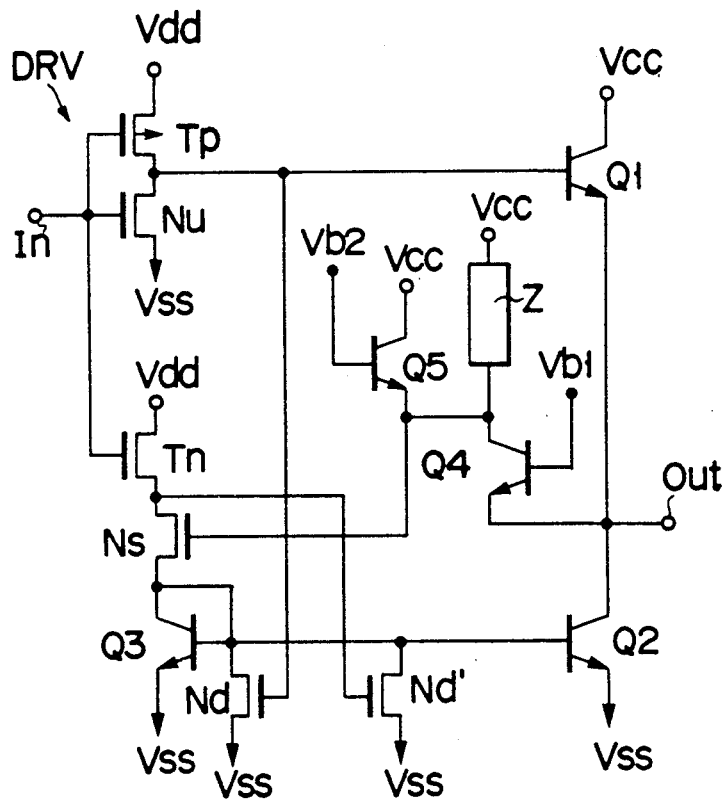
FIG. 4 is a circuit diagram of a Bi-CMOS inverter according to still another embodiment of the present invention.

A Bi-CMOS inverter shown in FIG. 4 is different from that of FIG. 3 in the following points. In the output transistor driver DRV, an impedance element Z, such as a resistor and a MOS transistor, is inserted between the Vcc node and the collector of the 4th polar transistor Q4. The collector-emitter path of a 5th npn bipolar transistor Q5 is inserted between the Vcc node and the collector of the transistor Q4. The base of the transistor Q5 is coupled for reception with a second reference potential Vb2 of about 2.1V, for example. An n-channel MOS transistor Ns as a switching element is provided, whose drain-source path is inserted between the source of the n-channel MOS transistor Tn and the interconnection of the bases of the transistors Q3 and Q2, and whose gate is connected to the collector of the transistor Q4. The drain-source path of an n-channel MOS transistor Nd' for base charge pull-out is connected between the interconnection of the bases of the transistors Q3 and Q2, and the Vss potential. The gate of the transistor Nd' is connected to the drain of the switching transistor Ns. The remaining arrangement of FIG. 4 is the same as that of FIG. 3. In the arrangement, like portions are designated by like symbols in FIG. 3.

The basic operation of the Bi-CMOS inverter of FIG. 4 is similar to that of FIG. 3, except the following operations. When the input signal is logical "0", the MOS transistor Tp is in an on state. By the drain current of the transistor Tp, the pull-up transistor Q1 is driven, and the output potential is pulled up. At this time, the collector potential of the transistor Q4 has been pulled up to the Vcc potential by the impedance element Z. Accordingly, the transistor Q5 is in an off state. Since the output node Out has been pulled up, the transistor Q4 is also in an off state.

Before the potential at the output node Out drops to a satisfactorily low potential, the potential at the drain of the switching transistor Ns is substantially equal to the potential at the source, if the channel width of the MOS transistor Tn is much greater than that of the switching MOS transistor Ns. Under this condition, the MOS transistor Nd' for base charge pull-out is substantially in an off state. The drain current Id of the MOS transistors Tn and Ns drives the transistor Q3. By the transistor Q3, the pull-down transistor Q2 is driven, and the output potential is pulled down. When the output potential drops to approach Vb1-Vf, the transistor Q4 is turned on, and will clamp the output potential at the Vb1-Vf. At this time, a current flows through the impedance element Z. Accordingly, the collector potential of the transistor Q4 (emitter potential of the transistor Q5) drops below Vb2-Vf' (cutoff voltage of the transistor Q5)=1.4 V. In turn, the transistor Q5 is turned on to feed the collector current (clamp current) of the transistor Q4. When the collector potential of the transistor Q4 drops below the Vb2-Vf', a potential between the gate and the source of the switching transistor Ns is below the threshold voltage, so that the transistor Ns is placed substantially in an off state. Under this condition, the collector potential of the transistor Q3 drops, and the transistor Q3 is not driven, the pull-down transistor Q2 is not driven, and finally the flow of the current to pull down the output potential stops. At the same time, the drain potential of the switching transistor Ns is pulled up to the Vdd potential by the transistor Tn. The pull-up potential turns on the base charge pull-out transistor Nd'. It quickly pulls out the base charge of the transistor Q2, and quickly turns off the transistor Q2. In this case, a through current will temporarily flow between the clamp current flowing into the output node Out and the pull-down drive current of the transistor Q2. However, if an impedance of the impedance element Z is set to be large, the through current instantly stops. Thus, the transistors Q4 and Q5, the switching transistor Ns, and the like cooperate to detect a logic "0" level of the output potential, while at the same time, they clamp the output level, and feed it back to the output transistor driver DRV, thereby to stop its drive.

Also in the Bi-CMOS inverter of FIG. 4 thus arranged, none of the MOS transistors are directly connected to the output node. The inverter of FIG. 4 has advantageous effects comparable with those of the buffer circuit of FIG. 1. And, the circuit arrangement of FIG. 4 has another advantage in which almost no clamp current is consumed.

FIG. 5A is a circuit diagram of a three-state output buffer according to an additional embodiment of the present invention. The buffer is based on a modification of the Bi-CMOS inverter shown in FIG. 4. In the buffer, DO indicates an input signal; $\overline{DO}$, a complementary signal of the input signal DO; CLK, a clock signal; Dout, an output node. The input signal DO is inputted to a CMOS inverter 41 whose output signal enters one of the input terminals of a two-input CMOS NOR gate 42. The input signal $\overline{DO}$ enters one of the input terminals of a two-input CMOS NAND gate 43. The clock signal CLK is applied to the other input terminal of the NAND gate 43, and to a CMOS inverter 44. The output of the inverter 44 corresponds to another input of the NOR gate 42. Q1 to Q3 indicate npn bipolar transistors, and DRV indicates an output transistor driver, as in the circuit of FIG. 4. Also in the driver DRV, Q4 and Q5 indicate npn bipolar transistors; Ns, Nd, and Nd' represent n-channel MOS transistors; Z, an impedance element. Unlike the circuit arrangement of FIG. 4, an output signal of the NOR gate 42 is applied to the base of the transistor Q1. An output signal of the NAND gate 43 is applied to the gate of the base charge pull-out MOS transistor Nd. Further, a p-channel MOS transistor Pa is used in place of the n-channel MOS transistor in FIG. 4. An output signal of the NAND circuit 43 is applied to the gate of the MOS transistor Pa. The drain-source path of the transistor Nz is inserted between the emitter of the transistor Q3 and the Vss potential. The drain of the switching transistor Ns is connected to the gate of the transistor Nz. The drain-source path of the transistor Na is inserted between a first reference potential Vb1 and the base of the transistor Q4. The clock signal CLK is applied to the gate of the transistor Na. The drain-source of the transistor Nb is connected between the base of the transistor Q4 and the Vss potential. An output signal of the inverter 44 is applied to the gate of the transistor Nb. The source-drain path of the transistor Pb is inserted between the Vcc potential and the collector of the transistor Q4. The output signal of the NAND gate 43 is applied through a CMOS inverter 45 to the gate of the transistor Pb. The source-drain path of the transistor Pc is inserted between a reference potential Vb2 and the base of the transistor Q5. The output signal of the NAND gate 43 is applied to the gate of the transistor Pc. The drain-source path of the transistor Nc is placed between the base of the transistor Q5 and the Vss potential. An output signal of the NAND gate 43 is applied to the gate of the transistor Nc. The anode-cathode paths of a plurality of diodes Di are connected in series between the base of the transistor Q5 and the Vss potential.

The operation of the output buffer will be described. When the clock signal CLK is logic "1", the input signal DO is logic "1", and the input signal $\overline{DO}$ is logic "0", the output signals of the NOR gate 42 and the NAND gate 43 are both logic "1". The pull-up transistor Q1 is driven, and the output potential is pulled up to logic "1". At this time, the output signal of logic "1" of the NAND gate 43 turns off the transistor Pa. Accordingly, the pull-down transistor Q2 is turned off. At this time, the output signal of logic "1" of the NAND gate 43 turns on the base charge pull-out transistor Nd. It pulls out the base charge of the transistor Q2, to prevent a through current from flowing in the transistor Q2. At this time, the transistor Na has been turned on by the clock signal CLK of logic "1", and hence the base potential of the transistor Q4 is Vb1 of about 1.3V. Since the output potential is logic "1", however, the transistor Q4 is in an off state. Also at this time, the output signal of logic "1" of the NAND gate 43 turns off the transistor Pc. The transistor Nc is turned on, and the base potential of the transistor Q5 is equal to the Vss potential. Accordingly, the output signal of logic "0" of the inverter 45 turns on the transistor Pb. Since the emitter potential of the transistor Q5 is equal to the Vcc potential, this transistor Q5 is in an off state.

When the clock signal CLK is logic "1", and the input signals DO and $\overline{DO}$ are logic "0" and "1", respectively, the output signals of the NOR gate 42 and the NAND gate 43 are both logic "0". The pull-up transistor Q1 is not driven. The base charge of the transistor Q1 is pulled out by an n-channel MOS transistor in the NOR gate 42. At this time, the output signal of "0" of the NAND gate 43 turns on the MOS transistor Pa. Accordingly, the transistor Q3 is driven. By this transistor Q3, the pull-down transistor Q2 is driven, and the output potential is pulled down to a logic "0" level. In this case, the output signal of logic "0" of the NAND gate 43, the MOS transistor Pc has been placed in an on state, and the base potential of the transistor Q5 is at Vb2 (about 2.1 V). At this time, with the output signal of logic "1" of the inverter 45, the transistor Pb is in an off state. The collector potential of the transistor Q4 has been pulled up to the Vcc potential by the impedance element Z. Accordingly, the transistor Q5 is in an off state. Also at this time, by the output signal of logic "0" of the NAND gate 43, the transistor Nd is turned off, and the transistor Pa is turned on. Before the potential at the output node Out becomes satisfactorily low, the drain and the source of the switching transistor Ns are both substantially the same potential, if the channel width of the transistor Ns is much larger than that of the transistor Pa. The transistors Nd' and Nz are placed substantially in an off state. The impedance of the MOS transistor closer to the emitter of the transistor Q3, Nz, is considerably high. Under this condition, the bipolar current mirror circuit consisting of the transistors Q3 and Q2 is driven by a small drive current. When the output potential becomes satisfactorily low and reaches approximately Vb1-Vf, the transistor Q4 is turned on, and will clamp the output potential at Vb1-Vf. At this time, a current flows through the impedance element Z, and the collector potential of the transistor Q4 (emitter potential of the transistor Q5) drops below Vb2-Vf' (cutoff voltage of the transistor Q5)=1.4V. Then, the transistor Q5 is turned on, and feeds the collector current (clamp current) of the transistor Q4. As the result of the reduction of the collector potential of the transistor Q4 below Vb2-Vf', the voltage between the gate and the source of the switching MOS transistor Ns is below the threshold voltage, and the transistor Ns is almost in an off state. The potential at the drain of the transistor Ns is pulled u to the Vdd potential by the MOS transistor Pa. The MOS transistors Nd' and Nz are in a low impedance state. Accordingly, the collector potential of the transistor Q3 drops, the transistor Q3 is not driven, the pull-down transistor Q2 is also not driven, and finally no current to pull down the output potential flows. In this case, a through current will temporarily flow between the clamp current flowing into the output node Out and the pull-down drive current of the transistor Q2. However, if an impedance of the impedance element Z is set to be large, the through current instantly stops. Thus, the transistors Q4 and Q5, the switching transistor Ns, and the like cooperate to detect a logic "0" level of the output potential, while at the same time, they clamp the output level, and feed it back to the output transistor driver DRV, thereby to stop its drive. In this way, the circuit arrangement of FIG. 5A has an advantage in which almost no clamp current is consumed.

When the clock signal CLK is logic "0", even if the input signals DO and $\overline{DO}$ are placed in any logic state, the output signal of the NOR gate 42 is logic "0", and the output signal of the NAND gate 43 is logic "1". The output drive bipolar transistors Q1 and Q2 are turned off. The base of the transistor Q5 is at the Vss potential. The base potential of the transistor Q4 is disconnected from the Vb1 potential, because the transistor Na is turned off. The transistor Nb is turned on and it is pulled down to the Vss potential, and the transistor Q4 is turned off. Therefore, the output node Out is placed in a high impedance state.

Also in the tri-state output buffer shown in FIG. 5A, the MOS transistor is indirectly connected to the output node Out, as in the Bi-CMOS inverter of FIG. 1. The circuit arrangement successfully prevents the external power source voltage from being directly applied to between the gate and the drain of the MOS transistor. In other words, the circuit arrangement ensures a good reliability of the gate oxide film of the MOS transistor. The tri-state output buffer of this embodiment, which succeeded in solving the gate oxide film reliability problem by the circuit technique, is free from the increase of the number of process steps, which results in reduction of a production yield, and increase of cost to manufacture. Those problems, as already mentioned, are inevitable problems of the prior art in which the gate oxide film of the MOS transistor in question is set to be thicker than those of other MOS transistors in the manufacturing stage.

In the tri-state output buffer circuit, as shown in FIG. 5B, a resistive component R as the transistor Nz is inserted between the emitter of the transistor Q3 and the Vss potential. Accordingly, a mathematic expression describing a relationship between the collector current Id and the output current Io is different from that of the Bi-CMOS inverter. The output current Io is given by $$Io = exp(Id \cdot R/VT) \cdot (A2/A3) \cdot Id$$

where A3 and A2 are the emitter areas of the transistors Q3 and Q2, and VT is a thermal voltage. As seen from the above expression, if $Id \cdot R > VT$, a large pull-down output current Io can be obtained, with a small drive current Id.

While in the above-mentioned embodiments, the logic circuit has a single input, it is evident that the present invention is applicable for a logic circuit with two or more inputs.

The logic circuits with two inputs will be described with reference to FIGS. 6 to 11.

In the logic circuits shown in FIGS. 6 and 7, in place of the arrangement of the output transistor driver DRV in the Bi-CMOS inverter shown in FIG. 2, another output transistor driver DRV is used. The driver DRV in this instance uses a plurality of p-channel MOS transistors Tpi and a plurality of n-channel MOS transistors Tni. Those transistors Tpi are connected in parallel or in series between the Vdd potential and the base of an npn bipolar transistor Q1 as a pull-up transistor. The transistors Tni are connected in parallel or in series between the Vdd potential and the base of an npn bipolar transistor Q2 as a pull-down transistor. The transistors Tpi and the transistors Tni are paired. Each pair of transistors is coupled at the gate with an input signal node Ini. With such arrangements, a Bi-CMOS NAND gate with two inputs and a Bi-CMOS NOR gate with two inputs are provided.

In the Bi-CMOS NAND gate with two inputs shown in FIG. 6, Q1 and Q2 designate pull-up and pull-down npn bipolar transistors; Tp1 and Tp2, p-channel transistors for the base current drive of the transistor Q1, which are coupled in parallel; Nu1 and Nu2, n-channel transistors for pulling out the base charge of the transistor Q1, which are connected in series; Tn1 and Tn2, n-channel transistors for the base current drive of the transistor Q2, which are connected in series; Nd an n-channel transistor for pulling out the base charge of the transistor Q2. Inputs 1 and 2 are applied to the gates of the transistor Tp1 and Tp2, respectively. Inputs 1 and 2 are applied to the gates of the transistor Tn1 and Tn2, respectively. Inputs 1 and 2 are applied to the gates of the transistor Nu1 and Nu2, respectively.

In the two-input NAND gate of FIG. 6, when either of the input inputs is logic "1", the transistor Tp1 or Tp2 is turned on, the base current of the transistor Q1 is driven, and the output is pulled up to logic "1". Only when the two inputs are logic "1", the transistors tn1 and Tn2 are turned on, and the base current of the transistor Q2 is driven, and the output is pulled down to logic "0". At this time, the transistor Q1 must be left off, but when the two inputs are logic "1", the transistors Nu1 and Nu2 pull out the base charge of the transistor Q1.

In the Bi-CMOS NOR gate with two inputs shown in FIG. 7, Q1 and Q2 designate pull-up and pull-down npn bipolar transistors; Tp1 and Tp2, p-channel transistors for the base current drive of the transistor Q1, which are coupled in series; Nu1 and Nu2, n-channel transistors for pulling out the base charge of the transistor Q1, which are connected in series; Tn1 and Tn2, n-channel transistors for the base current drive of the transistor Q2, which are connected in series; Nd, an n-channel transistor for pulling out the base charge of the transistor Q2. Inputs 1 and 2 are applied to the gates of the transistor Tp1 and Tp2, respectively. Inputs 1 and 2 are applied to the gates of the transistor Tn1 and Tn2, respectively. Inputs 1 and 2 are applied to the gates of the transistor Nu1 and Nu2, respectively.

In the two-input NOR gate of FIG. 7, only when the two input inputs are logic "0", the transistor Tp1 and Tp2 are turned on, the base current of the transistor Q1 is driven, and the output is pulled up to logic "1". When either of the two inputs is logic "1", the transistor tn1 or Tn2 is turned on, and the base current of the transistor Q2 is driven, and the output is pulled down to logic "0". At this time, the transistor Q1 must be left off, but when either of the two inputs is logic "1", the transistor Nu1 or Nu2 pulls out the base charge of the transistor Q1.

In the logic circuits shown in FIGS. 8 and 9, in place of the arrangement of the output transistor driver DRV in the Bi-CMOS inverter shown in FIG. 3, another output transistor driver DRV is used. The driver DRV in this instance uses a plurality of p-channel MOS transistors Tpi and a plurality of n-channel MOS transistors Tni. Those transistors Tpi are so arranged that the source-drain paths of the transistors are connected in parallel or in series between the Vdd potential and the base of an npn bipolar transistor Q1 as a pull-up transistor. The transistors Tni are so arranged that the drain-source paths of those transistors are connected in parallel or in series between the Vdd potential and the base of an npn bipolar transistor Q2 as a pull-down transistor. The transistors Tpi and the transistors Tni are paired. Each pair of transistors is coupled at the gate with an input signal node Ini. With such arrangements, a Bi-CMOS NAND gate with two inputs and a Bi-CMOS NOR gate with two inputs are provided. In the circuits of FIGS. 8 and 9, Q1 to Q9 designate npn bipolar transistors; Tp1 and Tp2, p-channel transistors; Tn1, Tn2, Nu1, Nu2, and Nd denote n-channel transistors; In1 and In2 represent input nodes, and Out indicates an output node.

In the logic circuits shown in FIGS. 10 and 11, in place of the arrangement of the output transistor driver DRV in the Bi-CMOS inverter shown in FIG. 4, another output transistor driver DRV is used. The driver DRV in this instance uses a plurality of p-channel MOS transistors Tpi and a plurality of n-channel MOS transistors Tni. Those transistors Tpi are so arranged that the source-drain paths of the transistors are connected in parallel or in series between the Vdd potential and the base of an npn bipolar transistor Q1 as a pull-up transistor. The transistors Tni are so arranged that the drain-source paths of those transistors are connected in parallel or in series between the Vdd potential and the drain of an n-channel MOS transistor Ns as a switching transistor. The transistors Tpi and the transistors Tni are paired. Each pair of transistors is coupled at the gate with an input signal node Ini. With such arrangements, a Bi-CMOS NAND gate with two inputs and a Bi-CMOS NOR gate with two inputs are provided. In the circuits of FIGS. 10 and 11, Q1 Q5 designate npn bipolar transistors; Tp1 and Tp2, p-channel transistors; Tn1, Tn2, Nu1, Nu2, Nd, and Nd' denote n-channel transistors; In1 and In2 represent input nodes, and Out indicates an output node.

As seen from the foregoing description, when a semiconductor logic circuit according to the present invention is applied to the output system of a Bi-CMOS semiconductor integrated circuit containing a power source voltage drop circuit, the MOS transistor in the output transistor driver is indirectly connected to the output node. The circuit arrangement successfully prevents the external power source voltage from being directly applied to between the gate and the drain of the MOS transistor. In other words, the circuit arrangement ensures a good reliability of the gate oxide film of the MOS transistor. The Bi-CMOS inverter of this embodiment, which succeeded in solving the gate oxide film reliability problem by the circuit technique, is free from the increase of the number of process steps, reduction of a production yield, and increase of cost to manufacture. Those problems, as already mentioned, are inevitable problems of the prior art in which the gate oxide film of the MOS transistor in question is set to be thicker than those of other MOS transistors in the manufacturing stage. Accordingly, the logic circuit according to the present invention is preferably applicable for various types of Bi-CMOS logic circuits in a Bi-CMOS semiconductor integrated circuit.

What is claimed is:

1. A semiconductor logic circuit comprising:
   a bipolar totem pole buffer comprising a first npn bipolar transistor whose collector is connected to a first power source node and whose emitter is connected to an output node, and a second npn bipolar transistor whose collector is connected to said output mode and whose emitter is connected to a second power source node;
   a third npn bipolar transistor whose collector and base are connected to the base of said second npn bipolar transistor and whose emitter is connected to said second power source node; and
   an output transistor drive circuit including a first MOS transistor whose drain-source path is connected between a third power source node and the base of said second npn bipolar transistor, and whose gate is connected to a signal input node and to the base of said first npn bipolar transistor, said third power source node being at a potential equal to or less than the potential of said first power source node.

2. The semiconductor logic circuit according to claim 1, in which said second npn bipolar transistor is of the Schottky barrier type.

3. The semiconductor logic circuit according to claim 1, further comprising a fourth MOS transistor whose drain-source path is connected between the base of said third bipolar transistor and said second power source node, and whose gate is connected to the base of said first bipolar transistor.

4. The semiconductor logic circuit according to claim 2, further comprising a fourth npn bipolar transistor whose collector is connected to said first power source node, whose emitter is connected to said output node, and whose base is coupled to receive a first reference potential.

5. A semiconductor logic circuit comprising:
   a bipolar totem pole buffer comprising a first npn bipolar transistor whose collector is connected to a first power source node, whose emitter is connected to an output node and whose base is coupled to a plurality of signal input nodes, and a second npn bipolar transistor whose collector is connected to said output node and whose emitter is connected to a second power source node;
   a third npn bipolar transistor whose collector and base are connected to the base of said second npn bipolar transistor and whose emitter is connected to said second power source node; and
   an output transistor drive circuit including a plurality of MOS transistors whose drain-source paths are connected in series between a third power source node and the base of said second npn bipolar transistor, and whose gates are connected to said plurality of signal input nodes, said third power source node being at a potential equal to or less than the potential of said first power source node.

6. The semiconductor logic circuit according to claim 5, in which said second npn bipolar transistor is of the Schottky barrier type.

7. The semiconductor logic circuit according to claim 5, further comprising a plurality of MOS transistors whose drain-source paths are connected in parallel between the base of said first bipolar transistor and said third power source node and whose gates are connected to the plurality of signal input nodes, whereby the base of said first bipolar transistor is coupled to the plurality of signal input nodes.

8. The semiconductor logic circuit according to claim 5, further comprising a fourth npn bipolar transistor whose collector is connected to said first power source node, whose emitter is connected to said output node, and whose base is coupled to receive a first reference potential.

9. The semiconductor logic circuit according to claim 8, further comprising an impedance element inserted between the collector of said fourth npn bipolar transistor and said first power source node, a first n-channel MOS transistor whose drain-source path is connected in series between one of the drain-source paths of said plurality of series connected MOS transistors of said output transistor drive circuit, and a fifth npn transistor whose collector is connected to said first power source node, whose emitter is connected to the gate of said first n-channel MOS transistor and the collector of said fourth bipolar transistor, and whose base is coupled to receive a second reference potential.

10. The semiconductor logic circuit according to claim 4, further comprising an impedance element inserted between the collector of said fourth npn bipolar transistor and said first power source node, a first n-channel MOS transistor whose drain-source path is connected between the drain-source paths of said plurality of series connected MOS transistors of said output transistor drive circuit and the base of said second npn bipolar transistor, and a fifth npn transistor whose collector is connected to said first power source node, whose emitter is connected to the gate of said first n-channel MOS transistor and the collector of said fourth bipolar transistor, and whose base is coupled to receive a second reference potential.

11. A semiconductor logic circuit comprising:
a bipolar totem pole buffer comprising a first npn bipolar transistor whose collector is connected to a first power source node, whose emitter is connected to an output node and whose base is coupled to a plurality of signal input nodes, and a second npn bipolar transistor whose collector is connected to said output node and whose emitter is connected to a second power source node;
a third npn bipolar transistor whose collector and base are connected to the base of said second npn bipolar transistor and whose emitter is connected to said second power source node; and
an output transistor drive circuit including a plurality of MOS transistors whose drain-source paths are connected in parallel between a third power source node and the base of said second npn bipolar transistor, and whose gates are connected to a plurality of signal input nodes, said third power source node being at a potential equal to or less than the potential of said first power source node.

12. The semiconductor logic circuit according to claim 11, in which said second npn bipolar transistor is of the Schottky barrier type.

13. The semiconductor logic circuit according to claim 11, further comprising a plurality of MOS transistors whose drain-source paths are connected in series between the base of said first bipolar transistor and said third power source node and whose gates are connected to the plurality of signal input nodes, whereby the base of said first bipolar transistor is coupled to the plurality of signal input nodes.

14. The semiconductor logic circuit according to claim 11, further comprising a fourth npn bipolar transistor whose collector is connected to said first power source node, whose emitter is connected to said output node, and whose base is coupled to receive a first reference potential.

15. The semiconductor logic circuit according to claim 14, further comprising an impedance element inserted between the collector of said fourth npn bipolar transistor and said first power source node, a first n-channel MOS transistor whose drain-source path whereby the connection between the drain-source path of the parallel connected plurality of MOS transistors and the base of said second npn bipolar transistor is omitted and is connected between the said parallel connected plurality of MOS transistors of said output transistor drive circuit and the base of said second npn bipolar transistor, and a fifth npn transistor whose collector is connected to said first power source node, whose emitter is connected to the gate of said first n-channel MOS transistor and the collector of said fourth bipolar transistor, and whose base is coupled to receive a second reference potential.

16. A semiconductor logic circuit comprising:
an input signal node;
an output node;
a first power source node;
a second power source node, said second power source node being at a potential less than said first power source node;
a third power source node, said third power source node being at a potential equal to or less than said first power source node and at a potential greater than said second power source node;
a first npn bipolar transistor whose collector is connected to said first power source node and whose emitter is connected to said output node;
a second npn bipolar transistor whose collector is connected to said output node and whose emitter is connected to said second power source node;
a third npn bipolar transistor whose collector and base are connected to the base of said second npn bipolar transistor and whose emitter is connected to said second power source node;
an output transistor drive circuit including a first MOS transistor whose drain-source path of the first MOS transistor connected between said third power source node and the base of said first npn bipolar transistor, and whose gate is connected to a signal input node; and
a second MOS transistor whose drain-source path is connected between the base of said second bipolar transistor and said third power source node and whose gate is connected to said signal input node.

17. The semiconductor logic circuit according to claim 16, further comprising a third MOS transistor whose drain-source path is connected between the base of said first bipolar transistor and said second power source node, and whose gate is connected to said signal input node.

18. The semiconductor logic circuit according to claim 16, further comprising a fourth MOS transistor whose drain-source path is connected between the base of said third bipolar transistor and said second power source node, and whose gate is connected to the base of said first bipolar transistor.

19. The semiconductor logic circuit according to claim 16, further comprising a fourth npn bipolar transistor whose collector is connected to said first power source node, whose emitter is connected to said output node, and whose base is coupled to receive a first reference potential.

20. A semiconductor logic circuit comprising:
an input signal node;
an output node;
a first power source node;

a second power source node, said second power source node being at a potential less than said first power source node;

a third power source node, said third power source node being at a potential equal to or less than said first power source node and at a potential greater than said second power source node;

a first reference potential;

a second reference potential;

a first npn bipolar transistor whose collector is connected to said first power source node and whose emitter is connected to said output node;

a second npn bipolar transistor whose collector is connected to said output node and whose emitter is connected to said second power source node;

a third npn bipolar transistor whose collector and base are connected to the base of said second npn bipolar transistor and whose emitter is connected to said second power source node;

a fourth npn bipolar transistor whose collector is connected to said first power source node through an impedance element, whose emitter is connected to said output node, and whose base is coupled to receive said first reference potential;

an output transistor drive circuit including a first MOS transistor whose drain-source path of the first MOS transistor connected between said third power source node and the base of said first npn bipolar transistor, and whose gate is connected to a signal input node; and a second MOS transistor whose drain-source path is connected between said third power source node and the drain-source path of a fifth MOS transistor and whose gate is connected to said signal input node;

the drain-source path of said fifth MOS transistor whose drain-source path is connected between the drain-source path of said second MOS transistor and the base of said second npn bipolar transistor, and a fifth npn bipolar transistor whose collector is connected to said first power source node and whose emitter is connected to the gate of said fifth MOS transistor and the collector of said fourth npn bipolar transistor, and the base of said fifth bipolar transistor is coupled to receive a second reference potential.

21. A semiconductor logic circuit comprising:

a first npn bipolar transistor whose collector is connected to a first power source node and whose emitter is connected to an output node;

a NOR circuit coupled with the base of said first bipolar transistor, the input to said NOR circuit coupled to at least one signal input node;

a second npn bipolar transistor whose collector is connected to said output node and whose emitter is connected to a second power source node;

a third npn bipolar transistor whose collector and base are connected to the base of said second npn bipolar transistor and whose emitter is connected to said second power source node;

an output transistor drive circuit including a first MOS transistor whose source drain path is connected between a third power source node and the drain-source path of a second MOS transistor, the gate of the first MOS transistor connected to an output of a NAND circuit, the input to said NAND circuit coupled to at least one signal input node, said third power source node being at a potential equal to or lower than the potential of said first power source node, said drain-source path of said second MOS transistor connected between the base of said second bipolar transistor and said drain-source path of said first MOS transistor, a fourth bipolar transistor whose collector is connected to an impedance element and the gate of said second MOS transistor and whose emitter is connected to said output node, and whose base is coupled to receive a first reference potential, said impedance element connected between the collector of said fourth bipolar transistor and said first power source node, and a fifth npn bipolar transistor whose collector is connected to said first power source node and whose emitter is connected to the gate of said second MOS transistor, and the base of said fifth bipolar transistor is coupled to receive a second reference potential.

22. The semiconductor logic circuit according to claim 21, further comprising a resistive element connected between the emitter of said third bipolar transistor and said second power source node, whereby the connection between the emitter of said third bipolar transistor and said second power source node is omitted.

23. The semiconductor logic circuit according to claim 22, in which said resistive element is an n-channel MOS transistor, the drain-source path of said n-channel MOS transistor connected between the emitter of said third bipolar transistor and said second power source node and the gate of said n-channel MOS transistor connected between the drain-source path of said first MOS transistor and the drain-source path of said second MOS transistor.

24. A semiconductor logic circuit comprising:

an input signal node;

an output node;

a first power source node;

a second power source node, said second power source node being at a potential less than said first power source node;

a third power source node, said third power source node being at a potential equal to or less than said first power source node and at a potential greater than said second power source node;

a first bipolar transistor having a first terminal, a second terminal and a third terminal, the third terminal controlling current in the first and second terminals, the first terminal being connected to said first power source node and the second terminal being connected to said output node;

a second bipolar transistor having a first terminal, a second terminal and a third terminal, the third terminal controlling current in the first and second terminals, the first terminal being connected to said output node and the second terminal being connected to said second power source node;

a third bipolar transistor having a first terminal, a second terminal and a third terminal, the third terminal controlling current in the first and second terminals, the first terminal and the third terminal being connected to the third terminal of said second bipolar transistor and the second terminal being connected to said second power source node;

an output transistor drive circuit including a first MOS transistor whose drain-source path is connected between said third power source node and the third terminal of said second bipolar transistor, and whose gate is connected to a signal input node and to the third terminal of said first bipolar transistor.

25. The semiconductor logic circuit according to claim 24, wherein said second bipolar transistor is a Schottky barrier type transistor.

26. The semiconductor logic circuit according to claim 24, further comprising a second MOS transistor whose drain-source path is connected between the third terminal of said third bipolar transistor and said second power source node and whose gate is connected to the third terminal of said first bipolar transistor.

27. The semiconductor logic circuit according to claim 24, further comprising a fourth bipolar transistor having a first terminal, a second terminal and a third terminal, the third terminal controlling the current in the first and second terminals, the first terminal of said fourth bipolar transistor connected to said first power source node, the second terminal of said fourth bipolar transistor connected to said output node, and the third terminal of said fourth bipolar transistor coupled to receive a first reference potential.

* * * * *